United States Patent
Lee et al.

(10) Patent No.: US 9,054,128 B2
(45) Date of Patent: Jun. 9, 2015

(54) PLASMA DOPING METHOD AND METHOD FOR FABRICATING SEMICONDUCTOR DEVICE USING THE SAME

(71) Applicant: SK hynix Inc., Gyeonggi-do (KR)

(72) Inventors: Jin-Ku Lee, Gyeonggi-do (KR);
Jae-Geun Oh, Gyeonggi-do (KR);
Young-Ho Lee, Gyeonggi-do (KR);
Mi-Ri Lee, Gyeonggi-do (KR);
Seung-Beom Baek, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/185,551

(22) Filed: Feb. 20, 2014

(65) Prior Publication Data

US 2014/0170828 A1  Jun. 19, 2014

Related U.S. Application Data

(62) Division of application No. 12/774,311, filed on May 5, 2010, now abandoned.

(30) Foreign Application Priority Data

Jan. 29, 2010 (KR) ........................ 10-2010-0008826

(51) Int. Cl.
*H01L 29/66* (2006.01)
*H01L 21/306* (2006.01)

(52) U.S. Cl.
CPC ........ *H01L 29/66575* (2013.01); *H01L 21/306* (2013.01)

(58) Field of Classification Search
USPC .................................................. 438/513, 530
See application file for complete search history.

(56) References Cited

U.S. PATENT DOCUMENTS

| | | | |
|---|---|---|---|
| 4,861,729 A | 8/1989 | Fuse et al. | |
| 6,703,274 B1 | 3/2004 | Chidambarrao et al. | |
| 8,063,438 B2 | 11/2011 | Son et al. | |
| 2004/0235281 A1 | 11/2004 | Downey et al. | |
| 2005/0158957 A1 | 7/2005 | Hwang et al. | |
| 2008/0290371 A1 | 11/2008 | Sheppard et al. | |
| 2009/0242966 A1 | 10/2009 | Son et al. | |

FOREIGN PATENT DOCUMENTS

CN          1490881          4/2004

OTHER PUBLICATIONS

Office Action issued by the USPTO for the parent U.S. Appl. No. 12/774,311 on May 23, 2012.
Notification of the First Office Action issued by the State Intellectual Property Office of People's Republic of China on Jun. 27, 2014.
Notification of the Second Office Action issued by the State Intellectual Property Office of People's Republic of China on Jan. 27, 2015.

*Primary Examiner* — Alexander Ghyka
(74) *Attorney, Agent, or Firm* — IP & T Group LLP

(57) ABSTRACT

A doping method that forms a doped region at a desired location of a three-dimensional (3D) conductive structure, controls the doping depth and doping dose of the doped region relatively easily, has a shallow doping depth, and prevents a floating body effect. A semiconductor device is fabricated using the same doping method. The method includes, forming a conductive structure having a sidewall, exposing a portion of the sidewall of the conductive structure, and forming a doped region in the exposed portion of the sidewall by performing a plasma doping process.

14 Claims, 16 Drawing Sheets

PLASMA DOPING METHOD AND METHOD FOR FABRICATING SEMICONDUCTOR DEVICE USING THE SAME

CROSS-REFERENCE TO RELATED APPLICATIONS

This application is a division of U.S. patent application Ser. No. 12/774,311 filed on May 5, 2010, which claims priority of Korean Patent Application No. 10-2010-0008826, filed on Jan. 29, 2010. The disclosure of each of the foregoing application is incorporated herein by reference in its entirety.

BACKGROUND OF THE INVENTION

Exemplary embodiments of the present invention relate to a method for fabricating a semiconductor device, and more particularly, to a plasma doping method and a method for fabricating a semiconductor device using the same.

When a specific region is doped during a fabrication process of a semiconductor device, an ion beam implantation method is usually used. The ion beam implantation method is also referred to as a "beam line implantation method."

As semiconductor devices become highly integrated, complicated three-dimensional (3D) structures are being developed, but however, doping of 3D structures through the ion beam implantation method is reaching its limits.

Such a concern in doping of 3D structures is described in detail below in reference to FIG. 1. To briefly explain the background, when a particular region of a conductive structure is to be selectively doped through the ion beam implantation method, the doping is performed at a predetermined angle. This is called "tilt ion implantation."

More specifically, FIG. 1 illustrates a tilt ion implantation doping method for a semiconductor device.

Referring to FIG. 1, a substrate 11 including a plurality of conductive structures 12 is formed. The plurality of conductive structures 12 are formed over the substrate 11 with a predetermined space between them.

To dope a specific region of a conductive structure 12, the doping is performed through a tilt ion implantation method (see reference numeral '13') because the gap between the conductive structures 12 is narrow and the conductive structures 12 are formed to have a predetermined height.

The tilt ion implantation 13 is performed at a certain tilt angle. However, a concern may arise in that a target region is not doped due to a shadow cast by, for example, the area 13A of a neighboring conductive structure 12 during the tilt ion implantation 13.

Also, although the tilt ion implantation 13 is performed, it is difficult to dope a doping target region with a desired level of doping concentration and a desired doping depth because the conductive structures 12 may be relatively tall and the gap between the conductive structures 12 may be relatively narrow.

Another way for doping a specific region of a 3D conductive structure is a method using a doped material such as doped polysilicon. When a doped material is used, a target region is doped by thermally diffusing the dopant of the doped material through an annealing process.

However, when a region is doped through thermal diffusion, it is difficult to control the doping depth and the doping dose. Further, when the doped material is removed for a subsequent process, a dopant loss occurs. Still further, it is hard to remove the doped material. Moreover, since the thermal diffusion method does not adequately control the doping depth when a shallow doping depth is required, floating body effect may occur.

SUMMARY OF THE INVENTION

An embodiment of the present invention is directed to a doping method that forms a doped region at a desired location of a three-dimensional (3D) conductive structure and controls the doping depth and doping dose of the doped region relatively easily, and a method for fabricating a semiconductor device using the same.

Another embodiment of the present invention is directed to a doping method that provides a shallow doping depth and prevents a floating body effect, and a method for fabricating a semiconductor device using the same.

In accordance with an embodiment of the present invention, a method for doping a semiconductor device includes: forming a conductive structure having a sidewall; exposing a portion of the sidewall of the conductive structure; and forming a doped region in the exposed portion of the sidewall by performing a plasma doping process.

The method may further include: forming a protective layer on a surface of the doped region; and performing an annealing process to activate the doped region. The method may further include: forming a protective layer on the surface of the doped region by performing an annealing process for activating the doped region.

In accordance with another embodiment of the present invention, a method for fabricating a semiconductor device includes: forming an active region having a sidewall by etching a substrate; exposing a portion of the sidewall of the active region; forming a junction in the exposed portion of the sidewall by performing a plasma doping process; and forming a protective layer on a surface of the junction.

The method may further include: removing the protective layer; forming a side contact coupled to the junction; and forming a buried bit line electrically coupled to the junction through the side contact. The forming of the protective layer may be performed while an annealing process for activating the junction is performed simultaneously.

In accordance with yet another embodiment of the present invention, a method for fabricating a semiconductor device includes: forming a conductive structure having a sidewall by etching a substrate with a hard mask pattern used as an etch barrier; forming a liner layer covering the conductive structure; forming a first anti-doping layer filling a portion of a gap between the conductive structure and a second anti-doping layer covering a first sidewall of each of the conductive structure over the liner layer; forming a contact region exposing a portion of a second sidewall of the conductive structure by removing the liner layer and a portion of the first anti-doping layer formed over the second sidewall; forming a junction in the contact region by performing a plasma doping process; removing the second anti-doping layer; forming a protective layer on a surface of the junction; and removing the first anti-doping layer.

DESCRIPTION OF SPECIFIC EMBODIMENTS

Figure 1:
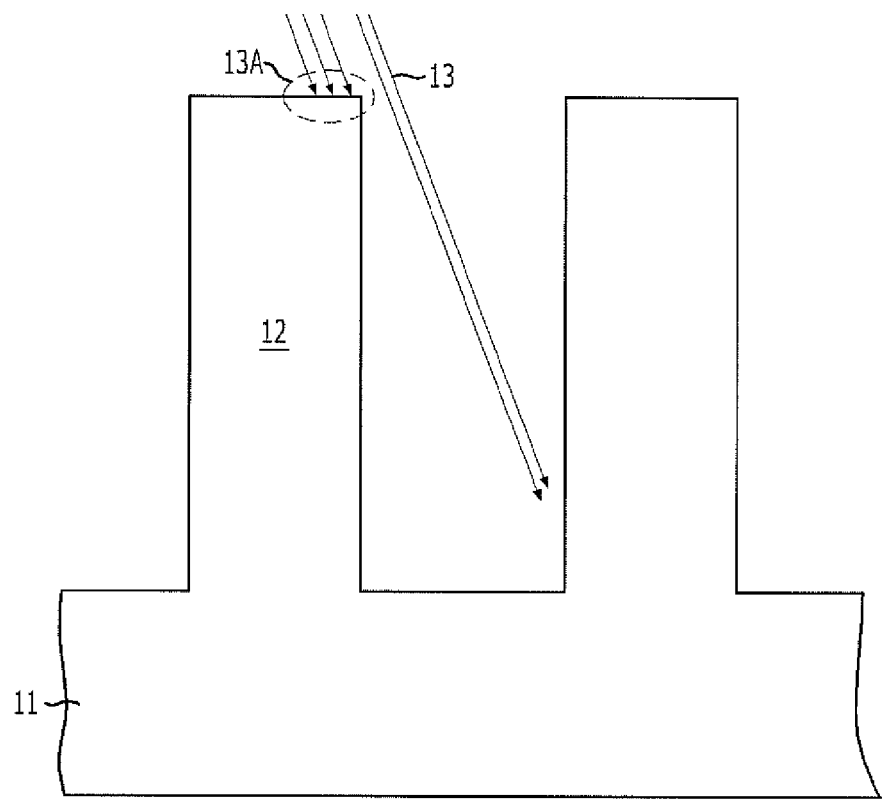
FIG. 1 illustrates a tilt-ion-implantation doping method for a semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
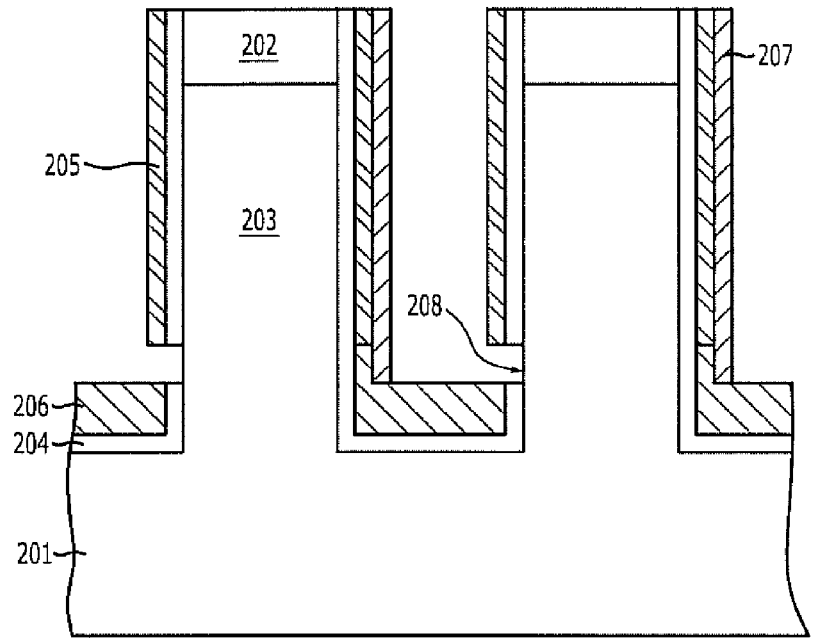
FIGS. 2A and 2B are cross-sectional views illustrating a doping method for a semiconductor device in accordance with a first embodiment of the present invention.
Figure 2B:
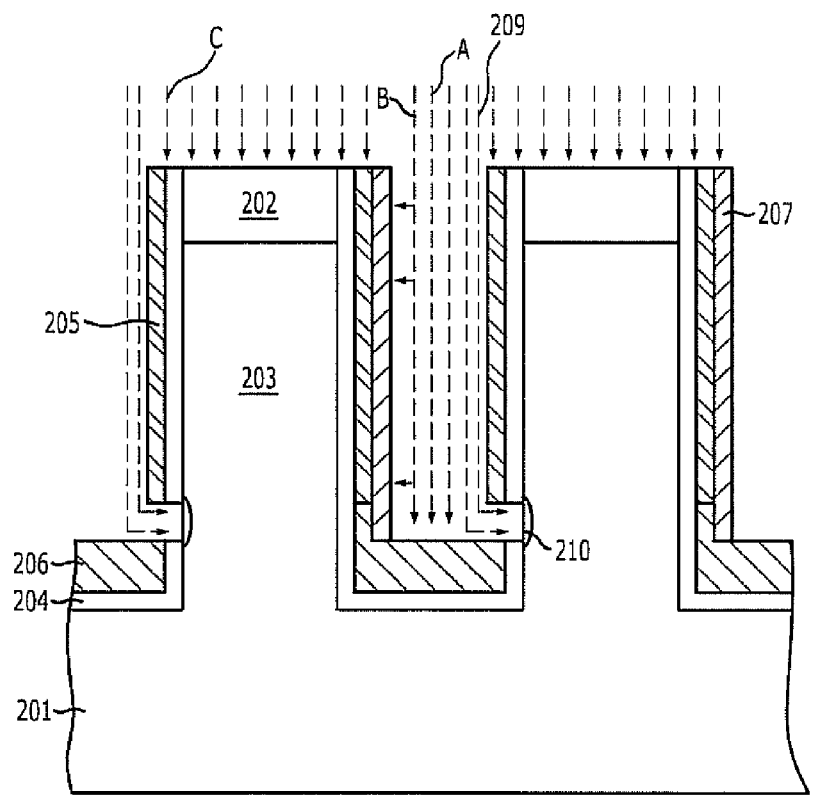

FIGS. 2A and 2B are cross-sectional views illustrating a doping method for a semiconductor device in accordance with a first embodiment of the present invention.

Referring to FIG. 2A, a plurality of conductive structures 203 are formed over a substrate 201. The substrate 201 includes a silicon substrate. The conductive structures 203 are formed by etching the substrate 201. Since the substrate 201 includes a silicon substrate, the conductive structures 203 include silicon as well. The conductive structures 203 extend on the surface of the substrate 201 in a direction perpendicular to the illustration page for FIG. 2A. The conductive structures 203 include line-type pillars (that is, pillars each forming a line). The conductive structures 203 include an active region. The active region is an area where a channel region, a source region, and a drain region of a transistor are formed. The source region and the drain region are also referred to as a "junction." The conductive structures 203 have sidewalls, which include at least a first sidewall and a second sidewall. Since the conductive structures 203 include an active region in the form of a pillar-type active region having a line shape. The line-shaped pillar-type active region is called "line-type active pillar."

A hard mask layer 202 is formed over the upper portions of the conductive structures 203. The hard mask layer 202 functions as an etch barrier in forming the conductive structures 203. The hard mask layer 202 may be formed of a dielectric material, such as an oxide and a nitride. According to an example, a nitride layer is used as the hard mask layer 202. The hard mask layer 202 may also include a silicon nitride layer.

An insulation layer is formed on both sidewalls of the conductive structures 203, the surface of the substrate 201 between the conductive structures 203, and the sidewalls of the hard mask layer 202. The insulation layer includes a first liner layer 204 and a second liner layer 205. The first liner layer 204 includes an oxide layer such as a silicon oxide layer. The second liner layer 205 includes a nitride layer such as a silicon nitride layer.

An opening 208 is formed by removing a portion of the insulation layer. The opening 208 has a one-side-opening (OSO) structure which selectively exposes a portion of the sidewalls of a conductive structure 203. The opening 208 may be a line-type opening.

A first anti-doping layer 206 and a second anti-doping layer 207 are formed on the surface of the insulation layer. The first anti-doping layer 206 fills a portion of the gap between the conductive structures 203. The second anti-doping layer 207 is formed on the insulation layer over an unopened sidewall of the conductive structure 203 that is opposite from the sidewall where the opening 208 is formed. The first anti-doping layer 206 protects the substrate 201 between the conductive structures 203 from being doped during a subsequent plasma doping process. The second anti-doping layer 207 protects the unopened sidewall of the conductive structure 203 from being doped during a subsequent plasma doping process. The first anti-doping layer 206 and the second anti-doping layer 207 operate as an insulation layer. The first anti-doping layer 206 includes undoped polysilicon. The second anti-doping layer 207 includes a material having a selectivity with respect to the first anti-doping layer 206, the first liner layer 204, and the second liner layer 205. The second anti-doping layer 207 may include a metal nitride layer, such as titanium nitride (TiN) layer. The second anti-doping layer 207 may be formed of a spacer.

The insulation layer providing the opening 208 and the hard mask layer 202 may function as an anti-doping layer as well. Plasma doping is performed onto a portion of the sidewalls of the conductive structure 203 exposed through the opening 208 and not to other portions.

The first liner layer 204, the second liner layer 205, the first anti-doping layer 206, and the second anti-doping layer 207 function as anti-doping layers. The anti-doping layers provide the opening 208 exposing a portion of the sidewalls of the conductive structure 203. A method for forming the opening 208 will be described later with reference to FIGS. 7A to 7I.

Referring to FIG. 2B, a plasma doping process 209 is performed. Herein, a portion of the sidewalls of the conductive structure 203 exposed through the opening 208 is doped. As a result, a doped region 210 is formed. The doped region 210 includes a junction, which becomes a source region and a drain region of a transistor. The doped region 210 is formed on a portion of the sidewalls of a conductive structure 203 to constitute a one-side-junction (OSJ). Since the doped region 210 is formed through a plasma doping process 209, it forms a shallow sidewall junction.

During the plasma doping process 209, the upper portions of the conductive structures 203 are protected from being doped by the hard mask layer 202. The other sidewalls of the conductive structures 203 except for the portion of the sidewalls exposed through the opening 208 are protected by the first liner layer 204, the second liner layer 205, the first anti-doping layer 206 and the second anti-doping layer 207 from being doped (see reference signs A, B, and C). As to the first anti-doping layer 206 and the second anti-doping layer 207, they contribute to protecting the other sidewalls from being doped with a dopant except for the portion of the sidewalls exposed through the opening 208.

The plasma doping process 209 is a doping method of exciting a doping source into a plasma status and implanting dopant ions in the excited plasma into a specimen. For example, when a bias voltage is applied to the specimen, the dopant ions in the plasma may simultaneously gather over the surface of the specimen. Herein, the bias voltage may be referred to as doping energy.

The plasma doping process 209 is performed using a source of doping energy, a doping dose, and a doping source.

The doping source is a material containing a dopant to be applied to the doped region 210. The doping source includes a dopant gas. In the first embodiment of the present invention, the doping source may be a dopant gas such as arsenic (As) and phosphorus (P). For example, the doping source may include arsine ($AsH_3$) or phosphine ($PH_3$). The arsenic (As) and phosphorus (P) are well-known N-type dopants. Also, a dopant gas containing boron (B) may be used as the doping source. Boron is a well-known P-type dopant.

The doping energy signifies a bias voltage applied to the substrate 201. The doping energy may be a voltage not higher than approximately 20 KV. To achieve a shallow depth of the doped area, the doping energy is adjusted to be as small as possible. For example, the doping energy may be lower than approximately 1 KV, while doping energy lower than approximately 20 KV is considered to be relatively low. Since ion implantation is generally performed based on projection range (Rp), high doping energy over approximately 30 KeV may be used. In performing the process, the doping energy is applied to the conductive structures 203 as well. Thus, the plasma doping process 209 may be performed in a sidewall direction (that is, a direction facing a sidewall). By the collision of ions in the excited plasma, the plasma doping process 209 performed in the sidewall direction is facilitated.

The doping dose affects the implantation amount of a dopant. The doping dose ranges from approximately $1\times10^{15}$ to approximately $1\times10^{17}$ atoms/$cm^2$. When the plasma doping process 209 is performed using the doping dose of the above-described range, the dopant applied to the doped region 210 forms a doping concentration of at least more than $1\times10^{20}$ atoms/$cm^3$.

To facilitate the plasma doping process 209, a gas for exciting the plasma may be introduced. The gas for exciting the plasma includes argon (Ar), helium (He) and so forth.

According to the above-described embodiment of the present invention described above, use of a tilt angle in the plasma doping process 209 may be avoided. Therefore, it is possible to perform doping without a shadow effect caused by a neighboring structure. As a result, the doped region 210 may be formed at a desired location.

Since the plasma doping process 209 uses a low doping energy of lower than approximately 20 KV, most of the dopant remains on the surface. Therefore, the doping depth of the doped region 210 formed by the plasma doping process 209 may be controlled to be shallow. Since the doping depth of the doped region 210 is controlled to be shallow, the floating body effect is prevented/reduced.

FIGS. 3A to 3E are cross-sectional views illustrating a doping method for a semiconductor device in accordance with a second embodiment of the present invention.

Figure 3A:
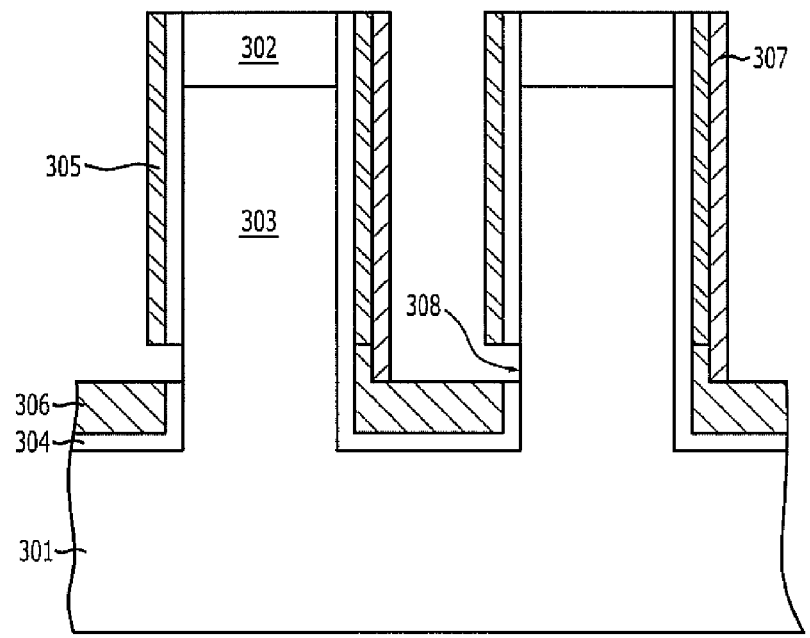
FIGS. 3A to 3E are cross-sectional views illustrating a doping method for a semiconductor device in accordance with a second embodiment of the present invention.

Referring to FIG. 3A, a plurality of conductive structures 303 are formed over a substrate 301. The substrate 301 includes a silicon substrate. The conductive structures 303 are formed by etching the substrate 201. Since the substrate 301 includes a silicon substrate, the conductive structures 303 include silicon as well. The conductive structures 303 extend on the surface of the substrate 301 in a direction perpendicular to the illustration page for FIG. 3A. The conductive structures 303 include line-type pillars (that is, pillars each forming a line). The conductive structures 303 include an active region. The active region is an area where a channel region, a source region, and a drain region of a transistor are formed. The source region and the drain region are also referred to as a "junction". The conductive structures 303 have sidewalls, which include at least a first sidewall and a second sidewall. Since the conductive structures 303 include the active region in the form of a pillar-type active region having a line shape. The line-shaped pillar-type active region is called "line-type active pillar."

A hard mask layer 302 is formed over the upper portions of the conductive structures 303. The hard mask layer 302 functions as an etch barrier in forming the conductive structures 303. The hard mask layer 302 may be formed of a dielectric material, such as an oxide and a nitride. According to an example, a nitride layer is used as the hard mask layer 302. The hard mask layer 302 may include a silicon nitride layer.

An insulation layer is formed on both sidewalls of the conductive structures 303, the surface of the substrate 301 between the conductive structures 303, and the sidewalls of the hard mask layer 302. The insulation layer includes a first liner layer 304 and a second liner layer 305. The first liner layer 304 includes an oxide layer such as a silicon oxide layer. The second liner layer 305 includes a nitride layer such as a silicon nitride layer.

An opening 308 is formed by removing a portion of the insulation layer. The opening 208 has a one-side-opening (OSO) structure which selectively exposes a portion of the sidewalls of a conductive structure 303. The opening 308 may be a line-type opening.

A first anti-doping layer 306 and a second anti-doping layer 307 are formed on the surface of the insulation layer. The first anti-doping layer 306 fills a portion of the gap between the conductive structures 303. The second anti-doping layer 307 is formed on the insulation layer over an unopened sidewall of the conductive structure 303 that is opposite from the sidewall where the opening 308 is formed. The first anti-doping layer 306 protects the substrate 301 between the conductive structures 303 from being doped during a subsequent plasma doping process. The second anti-doping layer 307 protects the unopened sidewall of the conductive structure 303 from being doped during a subsequent plasma doping process. The first anti-doping layer 306 and the second anti-doping layer 307 operate as an insulation layer. The first anti-doping layer 306 includes undoped polysilicon. The second anti-doping layer 307 includes a material having a selectivity with respect to the first anti-doping layer 306, the first liner layer 304, and the second liner layer 305. The second anti-doping layer 307 may include a metal nitride layer, such as titanium nitride (TIN) layer. The second anti-doping layer 307 may be formed of a spacer.

The insulation layer providing the opening 308 and the hard mask layer 302 may function as an anti-doping layer as well. Plasma doping is performed onto a portion of the sidewalls of the conductive structure 303 exposed through the opening 308 and not to other portions.

The first liner layer 304, the second liner layer 305, the first anti-doping layer 306, and the second anti-doping layer 307 function as anti-doping layers. The anti-doping layers provide the opening 308 exposing a portion of the sidewalls of the conductive structure 303. A method for forming the opening 308 will be described later with reference to FIGS. 7A to 7I.

Figure 3B:
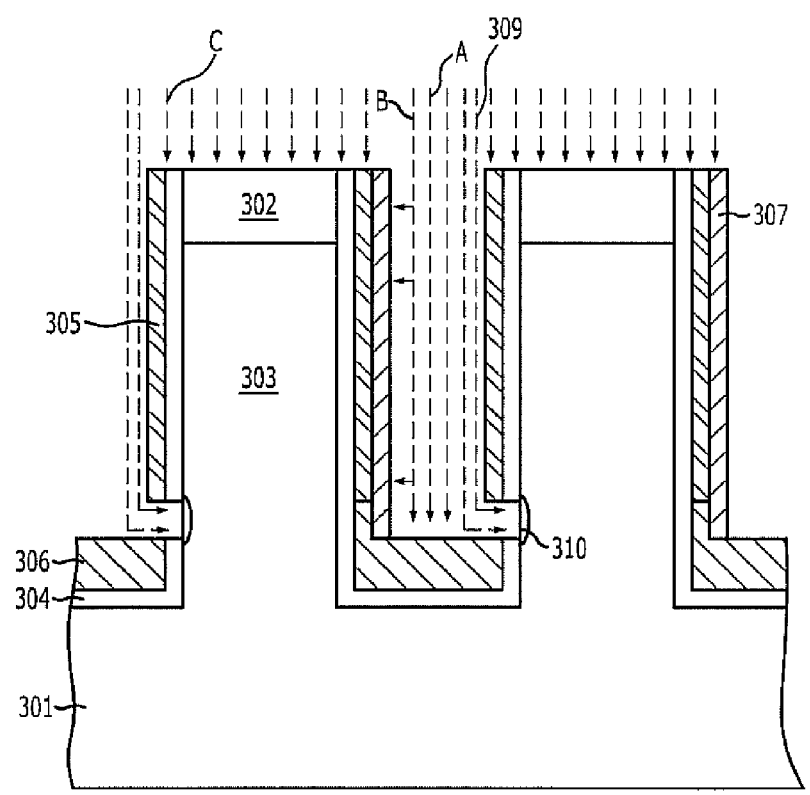

Referring to FIG. 3B, a plasma doping process 309 is performed. Herein, a portion of the sidewalls of the conductive structure 303 exposed through the opening 308 is doped. As a result, a doped region 310 is formed. The doped region 310 includes a junction, which becomes a source region and a drain region of a transistor. The doped region 310 is formed on a portion of the sidewalls of a conductive structure 303 to constitute a one-side-junction (OSJ). Since the doped region 310 is formed through a plasma doping process 309, it forms a shallow sidewall junction.

During the plasma doping process 309, the upper portions of the conductive structures 303 are protected from being doped by the hard mask layer 302. The other sidewalls of the conductive structures 303 except for the portion of the sidewalls exposed through the opening 308 are protected by the first liner layer 304, the second liner layer 305, the first anti-doping layer 306 and the second anti-doping layer 307 from being doped (see reference signs A, B, and C). As to the first anti-doping layer 306 and the second anti-doping layer 307, they contribute to protecting the other sidewalls from being doped with a dopant except for the portion of the sidewalls exposed through the opening 208.

The plasma doping process 309 is a doping method of exciting a doping source into a plasma status and implanting dopant ions in the excited plasma into a specimen. For example, when a bias voltage is applied to the specimen, the dopant ions in the plasma may simultaneously gather over the surface of the specimen. Herein, the bias voltage may be referred to as doping energy.

The plasma doping process 309 is performed using a source of doping energy, a doping dose, and a doping source.

The doping source is a material containing a dopant to be applied to the doped region 310. The doping source includes a dopant gas. In the second embodiment of the present invention, the doping source may be a dopant gas containing arsenic (As) and phosphorus (P). For example, the doping source includes arsine ($AsH_3$) or phosphine ($PH_3$). The arsenic (As) and phosphorus (P) are well-known N-type dopants. Also, a dopant gas containing boron (B) may be used as the doping source. Boron is well-known P-type dopant.

The doping energy signifies a bias voltage applied to the substrate 301. The doping energy may be a voltage not higher than at least approximately 20 KV. To achieve a shallow depth of the doped area, the doping energy is adjusted to be as small as possible. For example, the doping energy may be lower than approximately 1 KV, while doping energy lower than approximately 20 KV is considered to be relatively low. Since ion implantation is generally performed based on projection range (Rp), high doping energy over approximately 30 KeV may be used. In performing the process, the doping energy is applied to the conductive structures 303 as well. Thus, the plasma doping process 309 may be performed in a sidewall direction (that is, a direction facing a sidewall). By the collision of ions in the exited plasma, the plasma doping process 309 performed in the sidewall direction is facilitated.

The doping dose affects the implantation amount of a dopant. The doping dose ranges from approximately $1 \times 10^{15}$ to approximately $1 \times 10^{17}$ atoms/$cm^2$. When the plasma doping process 309 is performed using the doping dose of the above-described range, the dopant applied to the doped region 310 forms a doping concentration of at least more than $1 \times 10^{20}$ atoms/$cm^3$.

To facilitate the plasma doping process 309, a gas for exciting the plasma may be introduced. The gas for exciting the plasma includes argon (Ar), helium (He) and so forth.

Figure 3C:
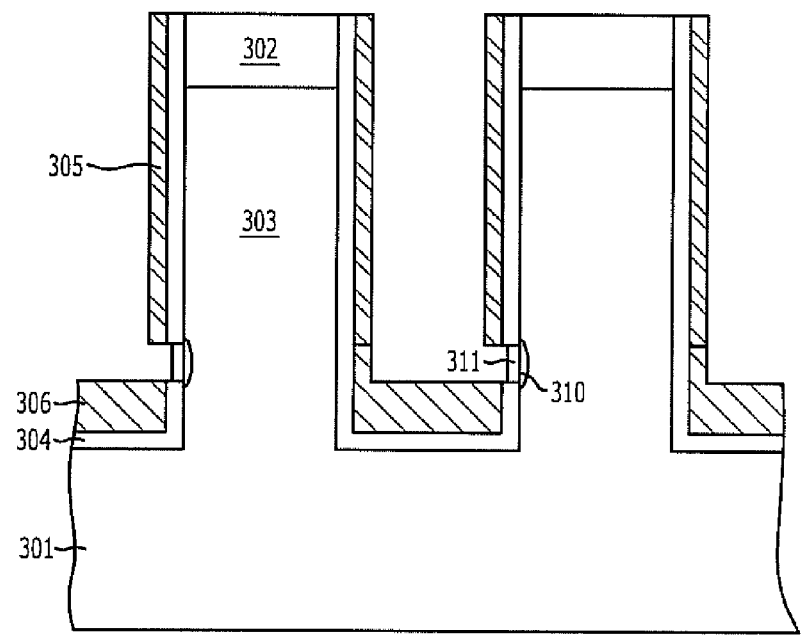

Referring to FIG. 3C, subsequent to the above-described steps for FIGS. 3A-3B, the second anti-doping layer 307 is removed. Subsequently, a protective layer 311 is formed on the surface of the doped regio" 310. The protective layer 311 protects the dopant of the doped region 310 from being lost during a subsequent process, such as a process of removing the first anti-doping layer 306.

In the second embodiment, the protective layer 311 is formed through a furnace oxidation or plasma oxidation, where the protective layer 311 is formed with a thickness of 50 Å.

Figure 3D:
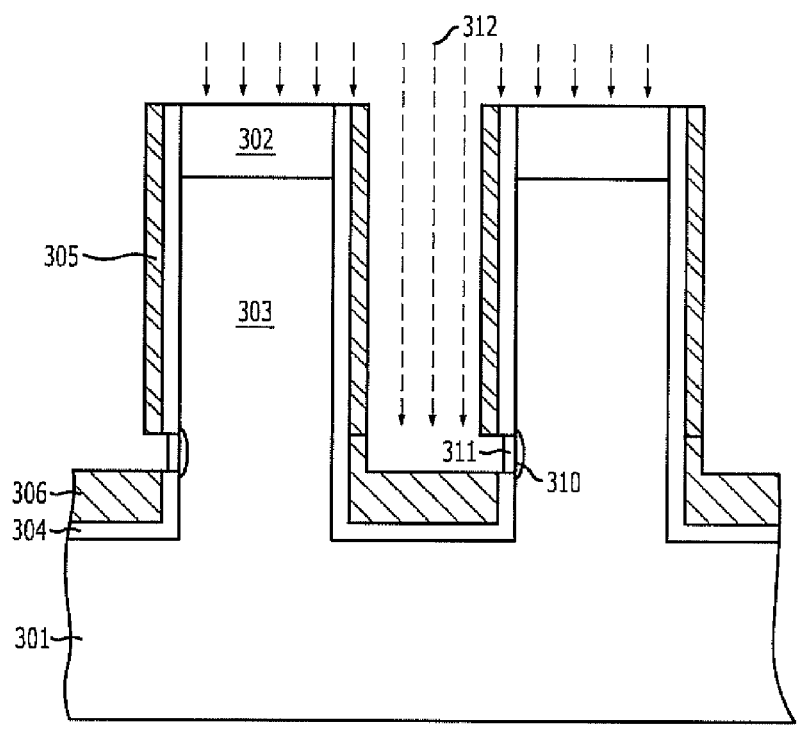

Referring to FIG. 3D, an annealing process 312 is performed to activate the dopant doping the doped region 310. The annealing process 312 may be a rapid thermal annealing (RTA).

Figure 3E:
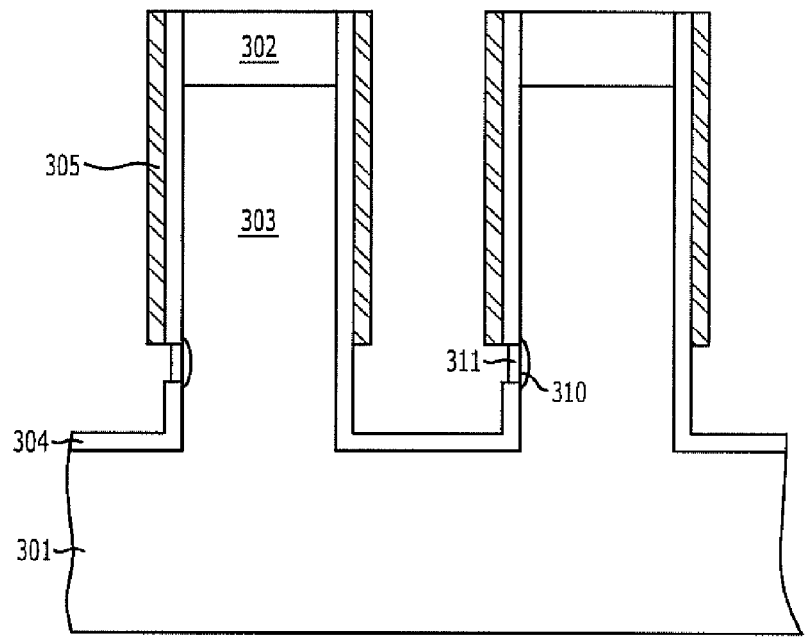

Referring to FIG. 3E, the first anti-doping layer 306 is removed. The first anti-doping layer 306 is removed through an etch process or a cleaning process. For example, when the first anti-doping layer 306 includes undoped polysilicon, a wet chemical or an etching gas capable of selectively removing polysilicon is used.

Since the first anti-doping layer 306 is removed after the formation of the protective layer 311, the loss of the dopant doping the doped region 310 is minimized/reduced.

Although not illustrated in the drawing, a structure linked to the side of the doped region 310 is formed subsequently for the second embodiment. The structure may, for example, be a bit line, a capacitor or a metal line.

According to the second embodiment of the present invention described above, use of a tilt angle in the plasma doping process 309 may be avoided. Therefore, doping may be performed without a shadow effect caused by a neighboring structure. As a result, the doped region 310 may be formed at a desired location.

Since the plasma doping process 309 uses a low doping energy of lower than approximately 20 KV, most of the dopant remains on the surface. Therefore, the doping depth of the doped region 310 formed by the plasma doping process 309 may be controlled to be shallow. Since the doping depth of the doped region 310 is controlled to be shallow, the floating body effect is prevented/reduced.

Also, since the loss of the dopant doping the doped region 310 is suppressed in the second embodiment, the doping concentration is maintained to be higher than $10^{20}$ atoms/$cm^3$.

Figure 4A:
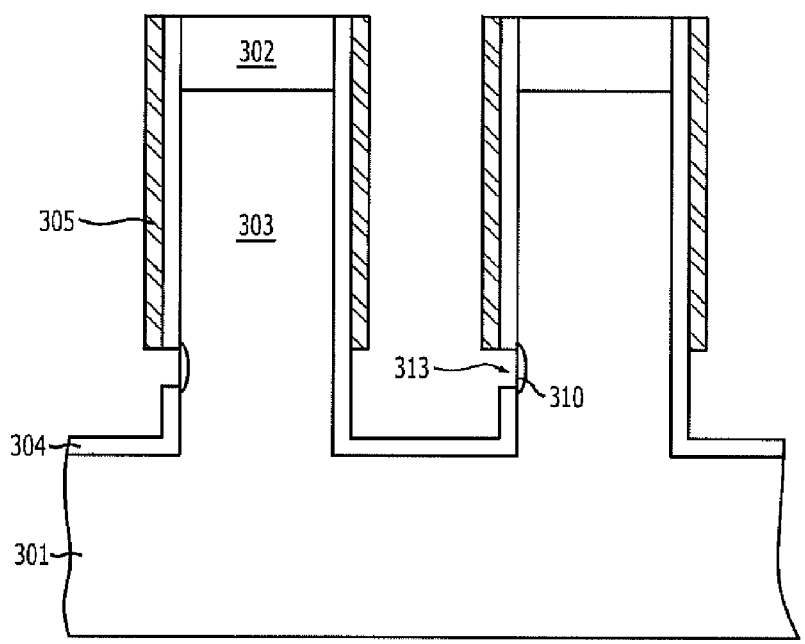
FIGS. 4A to 4C are cross-sectional views illustrating a semiconductor device fabrication method using the doping method according to the second embodiment of the present invention.
Figure 4B:
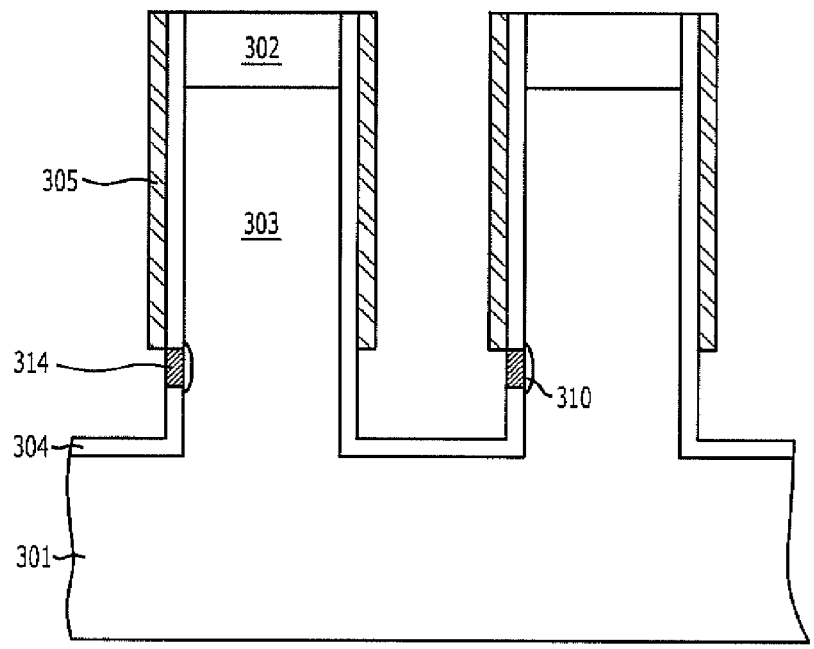
Figure 4C:
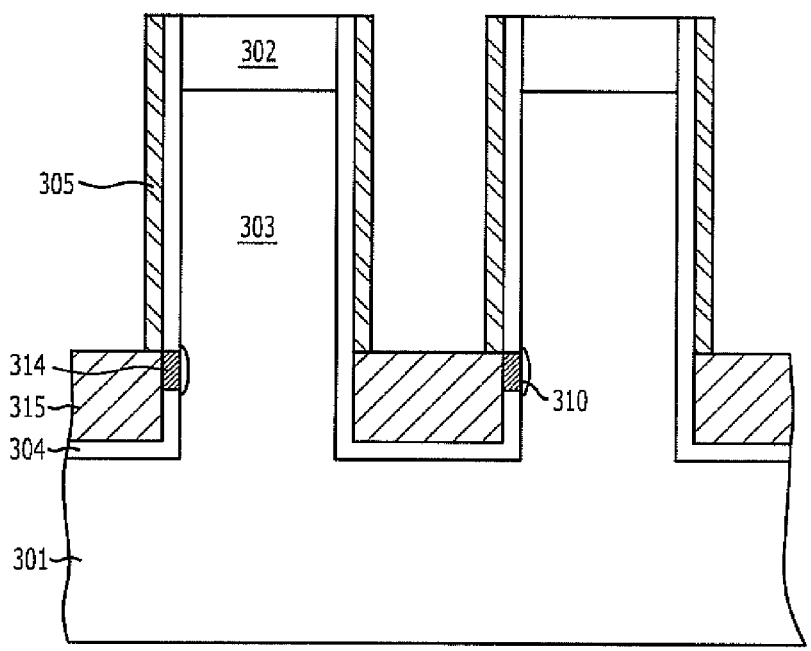

FIGS. 4A to 4C are cross-sectional views illustrating a semiconductor device fabrication method using the doping method according to the second embodiment of the present invention. The drawings show cross-sectional views after the protective layer 311 and the doped region 310 are formed as shown in FIGS. 3A to 3E and the subsequent removal of the protective layer 311 as described below. The doped region 310 may function as a junction which becomes a source region or a drain region. Hereafter, a method for forming a buried bit line coupled to the doped region 310 will be described.

Referring to FIG. 4A, the protective layer 311 is removed. Accordingly, a contact region 313 exposing a side of the doped region 310 is formed. The contact region 313 has the same shape as the opening 308.

Referring to FIG. 4B, a side contact 314 coupled to the conductive structure 303 is formed, where the side contact 314 may be a metal silicide. Examples of the metal silicide include titanium silicide ($TiSi_2$), cobalt silicide ($CoSi_2$), and nickel silicide (NiSi). For example, titanium silicide (TiSi$_2$) is formed by sequentially depositing a titanium (Ti) layer and a titanium nitride (TIN) layer and performing a thermal treatment. Subsequently, titanium not reacted with the titanium nitride is removed. The titanium reacted with the titanium nitride may remain, where it forms barrier metal. Alternatively, cobalt silicide (CoSi$_2$), which is more stable at a high temperature, may be selected in order to prevent deterioration during a subsequent high-temperature thermal treatment. The side contact 314 may be referred to as "a buried strap filling the contact region 313."

According to the above description, the side contact 314 has a one-side-contact (OSC) structure formed on one side of the conductive structure 303. When the side contact 314 is formed of a metal silicide, the concentration of the dopant doping the doped region 310 is maintained over $10^{20}$ atoms/cm$^3$. Therefore, silicide may be formed relatively easily.

Referring to FIG. 4C, a bit line conductive layer is deposited over the structure with the side contact 314 formed therein. The bit line conductive layer is deposited so as to fill the gap between the conductive structures 303. The bit line conductive layer includes a metal layer, such as titanium nitride (TiN) layer and a tungsten (W) layer. For example, the bit line conductive layer may be formed by stacking a titanium nitride layer and a tungsten (TiN/W) layer.

Subsequently, the bit line conductive layer is removed up to a certain height where a contact with the side contact 314 is maintained. Accordingly, a buried bit line 315 contacting the side contact 314 is formed. Here, the buried bit line 315 is arranged in parallel with the conductive structures 303, and the doped region 310 is electrically coupled to the buried bit line 315 through the side contact 314. The side contact 314 forms an ohmic contact between the doped region 310 and the buried bit line 315.

FIGS. 5A to 5D are cross-sectional views illustrating a doping method for a semiconductor device in accordance with a third embodiment of the present invention.

Figure 5A:
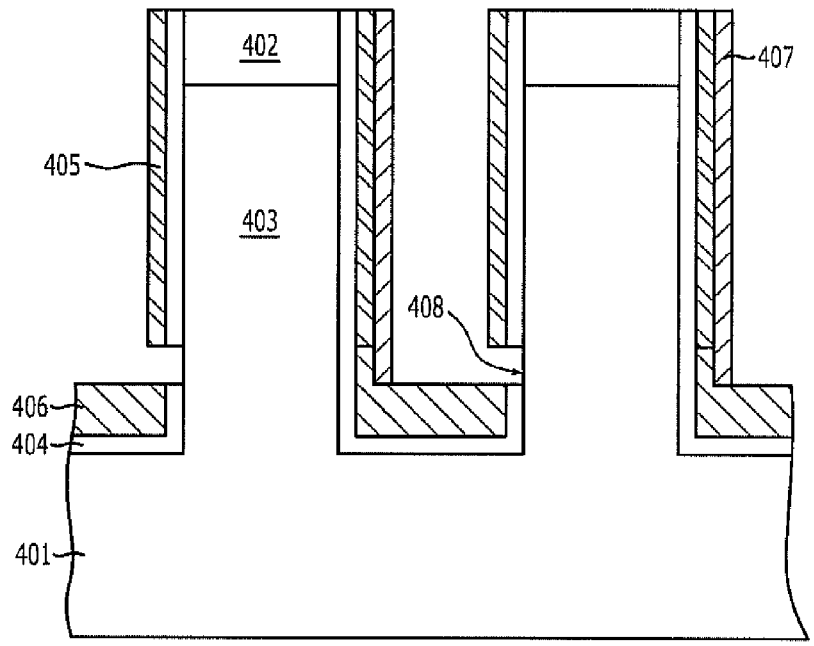
FIGS. 5A to 5D are cross-sectional views illustrating a doping method for a semiconductor device in accordance with a third embodiment of the present invention.

Referring to FIG. 5A, a plurality of conductive structures 403 are formed over a substrate 401. The substrate 401 includes a silicon substrate. The conductive structures 403 are formed by etching the substrate 401. Since the substrate 401 includes a silicon substrate, the conductive structures 403 include silicon as well. The conductive structures 403 extend the surface of the substrate 401 in a direction perpendicular to the illustration page for FIG. 5A. The conductive structures 403 include line-type pillars (that is, pillars each forming a line). The conductive structures 403 include an active region. The active region is an area where a channel region, a source region, and a drain region of a transistor are formed. The source region and the drain region are also referred to as a "junction". The conductive structures 403 have sidewalls, which include at least a first sidewall and a second sidewall. Since the conductive structures 403 include an active region in the form of a pillar-type active region having a line shape. The line-shaped pillar-type active region is called "line-type active pillar."

A hard mask layer 402 is formed over the upper portions of the conductive structures 403. The hard mask layer 402 functions as an etch barrier in forming the conductive structures 403. The hard mask layer 402 may be formed of a dielectric material, such as an oxide and a nitride. According to an example, a nitride layer is used as the hard mask layer 402. The hard mask layer 402 may include a silicon nitride layer.

An insulation layer is formed on both sidewalls of the conductive structures 403, the surface of the substrate 401 between the conductive structures 403, and the sidewalls of the hard mask layer 402. The insulation layer includes a first liner layer 404 and a second liner layer 405. The first liner layer 404 includes an oxide layer such as a silicon oxide layer. The second liner layer 405 includes a nitride layer such as a silicon nitride layer.

An opening 408 is formed by removing a portion of the insulation layer. The opening 408 has a one-side-opening (OSO) structure which selectively exposes a portion of the sidewalls of a conductive structure 403. The opening 408 may include a line-type opening.

A first anti-doping layer 406 and a second anti-doping layer 407 are formed on the surface of the insulation layer. The first anti-doping layer 406 fills a portion of the gap between the conductive structures 403. The second anti-doping layer 407 is formed on the insulation layer an unopened sidewall of the conductive structure 403 that is opposite from the sidewall where the opening 408 is formed. The first anti-doping layer 406 protects the substrate 401 between the conductive structures 403 from being doped during a subsequent plasma doping process. The second anti-doping layer 407 protects the unopened sidewall of the conductive structure 403 from being doped during a subsequent plasma doping process. The first anti-doping layer 406 and the second anti-doping layer 407 operate as an insulation layer. The first anti-doping layer 406 includes undoped polysilicon. The second anti-doping layer 407 includes a material having a selectivity with respect to the first anti-doping layer 406, the first liner layer 404, and the second liner layer 405. The second anti-doping layer 407 may include a metal nitride layer, such as titanium nitride (TiN) layer. The second anti-doping layer 407 may be formed of a spacer.

The insulation layer providing the opening 408 and the hard mask layer 402 may function as anti-doping layer as well. Plasma doping is performed onto a portion of the sidewalls of the conductive structure 303 exposed through the opening 408 and not to other portions.

The first liner layer 404, the second liner layer 405, the first anti-doping layer 406, and the second anti-doping layer 407 function as anti-doping layers. The anti-doping layers provide the opening 408 exposing a portion of the sidewalls of the conductive structure 403. A method for forming the opening 408 will be described later with reference to FIGS. 7A to 7I.

Figure 5B:
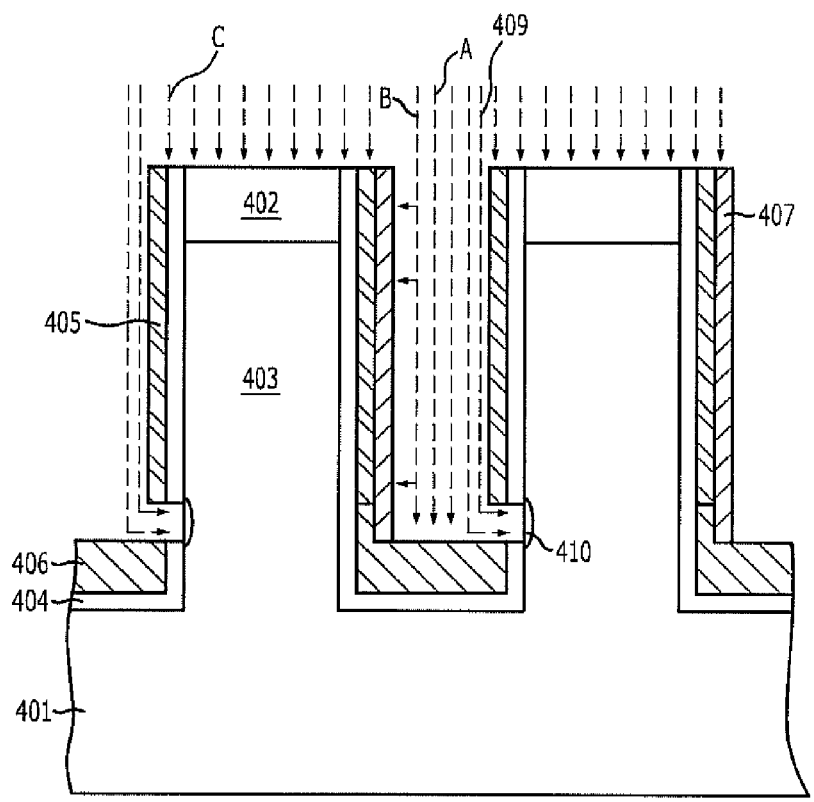

Referring to FIG. 5B, a plasma doping process 409 is performed. Herein, a portion of the sidewalls of the conductive structure 403 exposed through the opening 408 is doped. As a result, a doped region 410 is formed. The doped region 410 includes a junction, which becomes a source region and a drain region of a transistor. The doped region 410 is formed on a portion of the sidewalls of a conductive structure 403 to constitute a one-side-junction (OSJ). Since the doped region 410 is formed through a plasma doping process 409, it forms a shallow sidewall junction.

During the plasma doping process 409, the upper portions of the conductive structures 403 are protected from being doped by the hard mask layer 402. The other sidewalls of the conductive structures 403 except for the portion of the sidewalls exposed through the opening 408 are protected by the first liner layer 404, the second liner layer 405, the first anti-doping layer 406 and the second anti-doping layer 407 from being doped (see reference signs A, B, and C). As to the first anti-doping layer 406 and the second anti-doping layer 407, they contribute to protecting the other sidewalls from being doped with a dopant except for the portion of the sidewalls exposed through the opening 408.

The plasma doping process 409 is a doping method of exciting a doping source into a plasma status and implanting dopant ions in the excited plasma into a specimen. For example, when a bias voltage is applied to the specimen, the dopant ions in the plasma may simultaneously gather over the surface of the specimen. Herein, the bias voltage may be referred to as doping energy.

The plasma doping process 409 is performed using a source of doping energy, a doping dose, and a doping source.

The doping source is a material containing a dopant to be applied to the doped region 410. The doping source includes a dopant gas. In the third embodiment of the present invention, the doping source may be a dopant gas containing arsenic (As) and phosphorus (P). For example, the doping source may include arsine ($AsH_3$) or phosphine ($PH_3$). The arsenic (As) and phosphorus (P) are well-known N-type dopants. Also, a dopant gas containing boron (B) may be used as the doping source. Boron is well-known P-type dopant.

The doping energy signifies a bias voltage applied to the substrate 401. The doping energy may be a voltage not higher than at least approximately 20 KV. To achieve a shallow depth of the doped area, the doping energy is adjusted to be as small as possible. For example, the doping energy may be lower than approximately 1 KV, while doping energy lower than approximately 20 KV is considered to be relatively low. Since ion implantation is generally performed based on projection range (Rp), high doping energy over approximately 30 KeV may be used. In performing the process, the doping energy is applied to the conductive structures 403 as well. Thus, the plasma doping process 409 may be performed in a sidewall direction (that is, a direction facing a sidewall). By the collision of ions in the excited plasma, the plasma doping process 409 performed in the sidewall direction is facilitated.

The doping dose affects the implantation amount of a dopant. The doping dose ranges from approximately $1 \times 10^{15}$ to approximately $1 \times 10^{17}$ atoms/$cm^2$. When the plasma doping process 309 is performed using the doping dose of the above-described range, the dopant applied to the doped region 410 forms a doping concentration of at least more than $1 \times 10^{20}$ atoms/$cm^3$.

To facilitate the plasma doping process 409, a gas for exciting the plasma may be introduced. The gas for exciting the plasma includes argon (Ar), helium (He) and so forth.

Figure 5C:
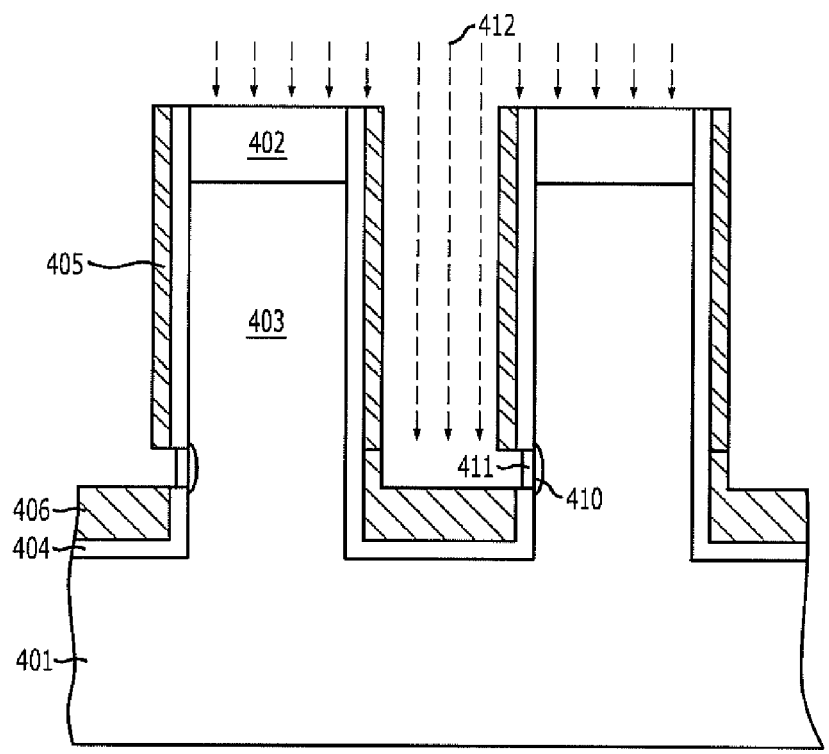

Referring to FIG. 5C, subsequent to the above-described steps for FIGS. 5A-5B, the second anti-doping layer 407 is removed. Subsequently, a protective layer 411 is formed on the surface of the doped region 410. The protective layer 411 is formed while performing an annealing process 412 for activating the dopant doping the doped region 410. The protective layer 411 protects the dopant of the doped region 410 from being lost during a subsequent process, such as a process of removing the first anti-doping layer 406.

In the third embodiment, a rapid thermal treatment (RTA) is used to perform the annealing process 412 while forming the protective layer 411. The protective layer 411 is formed by supplying an oxygen-containing gas or a nitrogen-containing gas while the rapid thermal treatment is performed simultaneously. The oxygen-containing gas may be oxygen gas. The nitrogen-containing gas may be nitrogen trifluoride ($NF_3$) gas. When the oxygen-containing gas flows in, the protective layer 411 turns into an oxide layer. When the nitrogen-containing gas flows in, the protective layer 411 turns into a nitride layer.

Figure 5D:
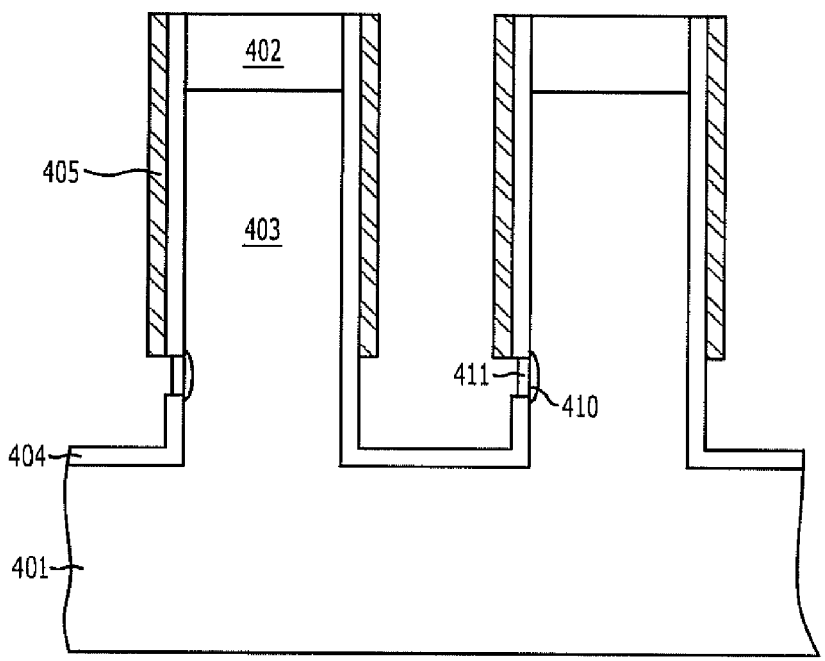

Referring to FIG. 5D, the first anti-doping layer 406 is removed. The first anti-doping layer 406 is removed through an etch process or a cleaning process. For example, when the first anti-doping layer 406 includes undoped polysilicon, a wet chemical or an etching gas capable of selectively removing polysilicon is used.

Since the first anti-doping layer 406 is removed after the formation of the protective layer 411, the loss of the dopant doping the doped region 410 is minimized/reduced.

Although not illustrated in the drawing, a structure linked to the side of the doped region 410 is formed subsequently for the second embodiment. The structure may, for example, be a bit line, a capacitor or metal line.

According to the third embodiment of the present invention described above, use of a tilt angle in the plasma doping process 409 may be avoided. Therefore, it is possible to perform doping without a shadow effect caused by a neighboring structure. As a result, the doped region 410 may be formed at a desired location.

Since the plasma doping process 409 uses a low doping energy of lower than approximately 20 KV, most of the dopant remains on the surface. Therefore, the doping depth of the doped region 410 formed by the plasma doping process 409 may be controlled to be shallow. Since the doping depth of the doped region 410 is controlled to be shallow, the floating body effect is prevented/reduced.

Also, since the loss of the dopant doping the doped region 310 is suppressed in the second embodiment, the doping concentration is maintained to be higher than $10^{20}$ atoms/$cm^3$.

Figure 6A:
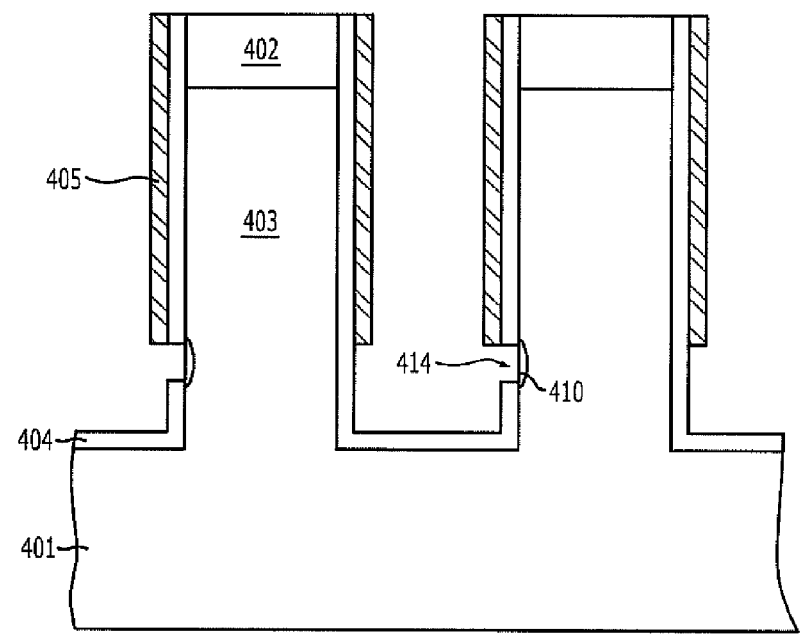
FIGS. 6A to 6C are cross-sectional views illustrating a semiconductor device fabrication method using the doping method according to the third embodiment of the present invention.
Figure 6B:
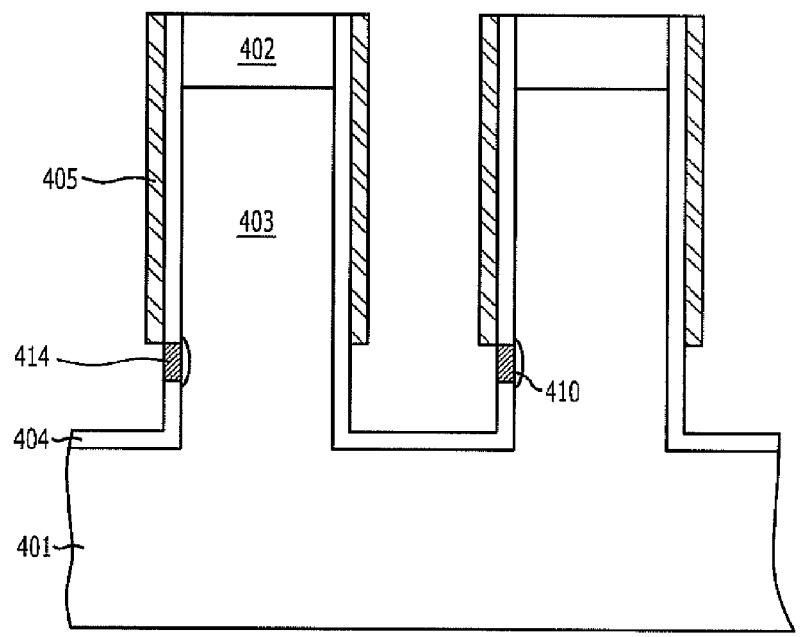
Figure 6C:
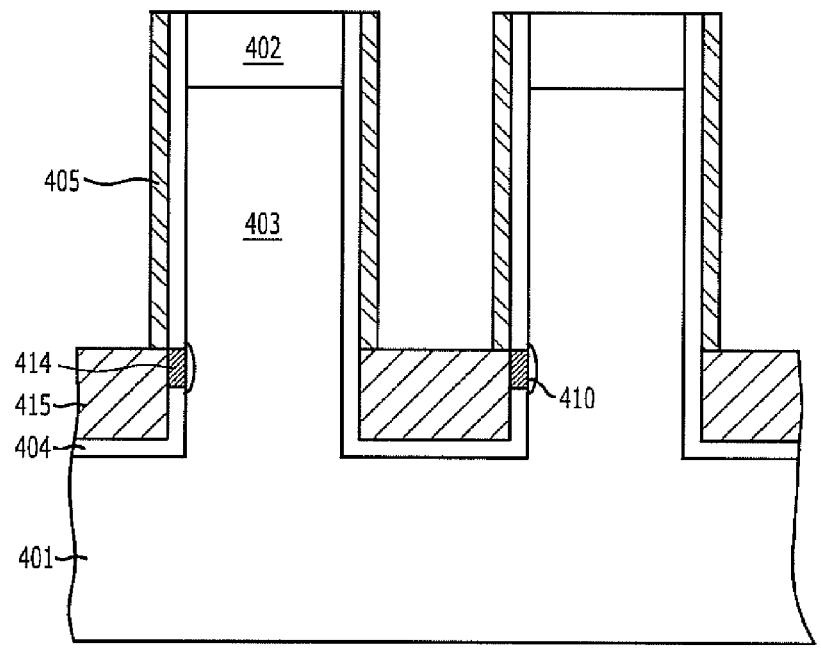

FIGS. 6A to 6C are cross-sectional views illustrating a semiconductor device fabrication method using the doping method according to the third embodiment of the present invention. The drawings show cross-sectional views after the protective layer 411 and the doped region 410 are formed as shown in FIGS. 5A to 5D. The doped region 410 may function as a junction which becomes a source region or a drain region.

Hereafter, a method for forming a buried bit line coupled to the doped region 410 will be described.

Referring to FIG. 6A, the protective layer 411 is removed. Accordingly, a contact region 413 exposing a side of the doped region 410 is formed. The contact region 413 has the same shape as the opening 408.

Referring to FIG. 6B, a side contact 414 coupled to the conductive structure 403 is formed, where the side contact 414 may be a metal silicide. Examples of the metal silicide include titanium silicide ($TiSi_2$), cobalt silicide ($CoSi_2$), and nickel silicide (NiSi). For example, titanium silicide ($TiSi_2$) is formed by sequentially depositing a titanium (Ti) layer and a titanium nitride (TIN) layer and performing a thermal treatment. Subsequently, titanium not reacted with the titanium nitride is removed. The titanium reacted with the titanium nitride may remain, where it forms barrier metal. Alternatively, cobalt silicide ($CoSi_2$), which is more stable at a high temperature, may be selected in order to prevent deterioration during a subsequent high-temperature thermal treatment. The side contact 414 fills the contact region 413. The side contact 414 may be referred to as "a buried strap filling the contact region 413."

According to the above description, the side contact 414 has a one-side-contact (OSC) structure formed on one side of the conductive structure 403. When the side contact 414 is formed of a metal silicide, the concentration of the dopant doping the doped region 410 is maintained over $10^{20}$ atoms/$cm^3$. Therefore, silicide may be formed relatively easily.

Referring to FIG. 6C, a bit line conductive layer is deposited over the structure with the side contact 414 formed therein. The bit line conductive layer is deposited so as to fill the gap between the conductive structures 403. The bit line conductive layer includes a metal layer, such as titanium nitride (TIN) layer and a tungsten (W) layer. For example, the bit line conductive layer may be formed by stacking a titanium nitride layer and a tungsten (TiN/W) layer.

Subsequently, the bit line conductive layer is removed up to a certain height where a contact with the side contact 414 is maintained. Accordingly, a buried bit line 415 contacting the side contact 414 is formed. Here, the buried bit line 415 is arranged in parallel with the conductive structures 403, and the doped region 410 is electrically coupled to the buried bit line 415 through the side contact 414. The side contact 414 forms an ohmic contact between the doped region 410 and the buried bit line 415.

FIGS. 7A to 7I are cross-sectional views illustrating a method for forming an opening on a sidewall of a conductive structure in accordance with the first to third embodiments of the present invention.

Figure 7A:
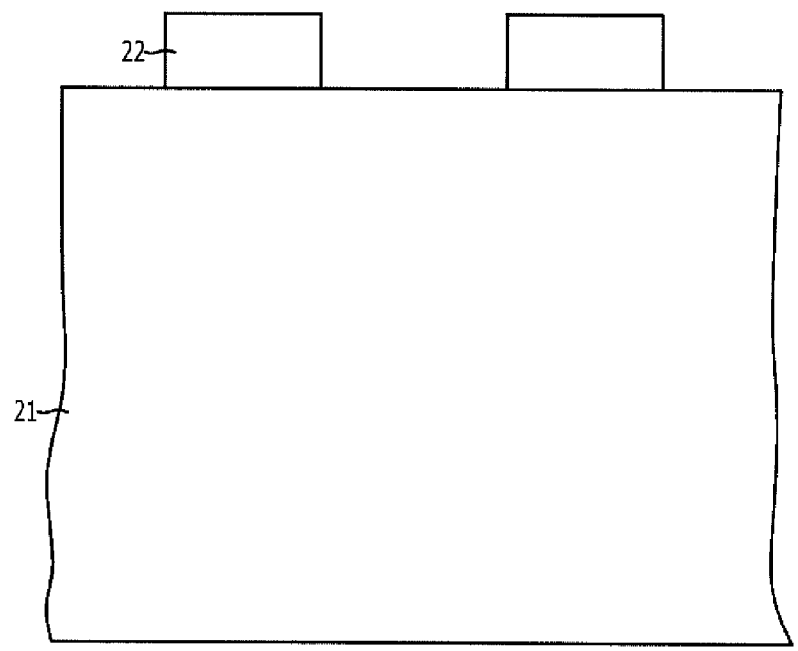
FIGS. 7A to 7L are cross-sectional views illustrating a method for forming an opening in accordance with the first to third embodiments of the present invention.

Referring to FIG. 7A, a hard mask layer 22 is formed over a substrate 21. The hard mask layer 22 includes a nitride layer. Also, the hard mask layer 22 may have a multi-layer structure including an oxide layer and a nitride layer. For example, the hard mask layer 22 may include a hard mask nitride layer and a hard mask oxide layer sequentially stacked therein. Also, the hard mask layer 22 may be a hard mask nitride layer, a hard mask oxide layer, a hard mask silicon oxynitride (SiON) and a hard mask carbon layer sequentially stacked therein. When the hard mask layer 22 includes a hard mask nitride layer, a pad oxide layer may be further formed between the substrate 21 and the hard mask layer 22. The hard mask layer 22 is formed using a photoresist pattern, which is not shown in the drawing.

Figure 7B:
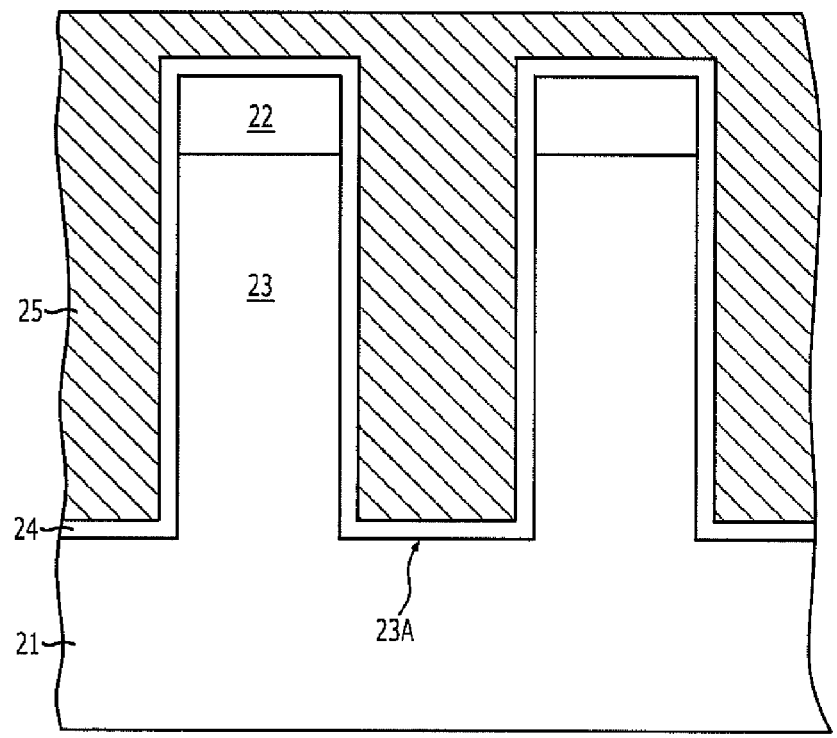

Referring to FIG. 7B, a trench etch process is performed using the hard mask layer 22 as an etch barrier. For example, conductive structures 23 are formed by etching the substrate 21 to a predetermined depth by using the hard mask layer 22 as an etch barrier. The conductive structures 23 are isolated from each other by trenches 23A formed therebetween. Each conductive structure 23 includes an active region where a transistor is formed. The conductive structure 23 includes two sidewalls. The trench etch process includes an anisotropic etch process. When the substrate 21 is a silicon substrate, the anisotropic etch process may include a plasma dry etch process using chlorine (Cl2) gas, hydrogen bromide (HBr) gas, or a mixed gas thereof. A plurality of conductive structures 23 are formed over a substrate 21A by the trenches 23A. The conductive structures 23 may be line-type pillars, e.g., line-type active pillars. Herein, the active pillars may also be referred to as "pillar-type active regions."

A first liner layer 24 is formed as an insulation layer. The first liner layer 24 includes an oxide layer, e.g., silicon oxide layer.

A first gap-fill layer 25 for gap-filling the trenches 23A between the conductive structures 23 is formed over the first liner layer 24. The first gap-fill layer 25 may be undoped polysilicon or amorphous silicon.

Figure 7C:
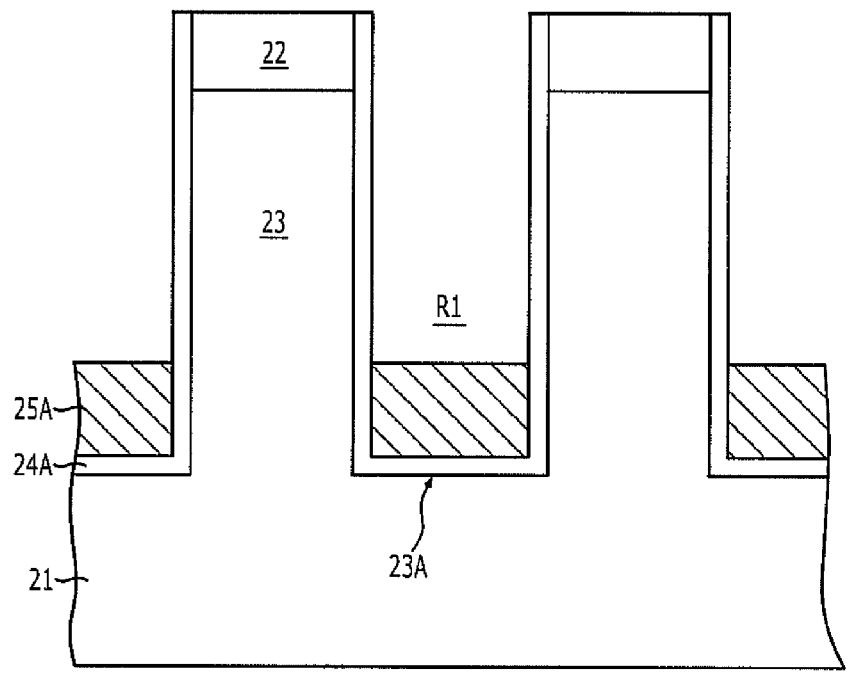

Referring to FIG. 7C, the first gap-fill layer 25 is planarized until the surface of the hard mask layer 22 is shown. The planarization of the first gap-fill layer 25 may use a chemical mechanical polishing (CMP) process. Subsequently, an etch-back process is performed. By performing the etch-back process, a first anti-doping layer 25A providing a first recess R1 is formed. During the chemical mechanical polishing (CMP) process, the first liner layer 24 over the hard mask layer 22 may be polished. Accordingly, a first liner pattern 24A covering both sidewalls of the hard mask layer 22 and both sidewalls of the trenches 23A is formed. The first liner pattern 24A covers the bottoms of the trenches 23A as well.

Figure 7D:
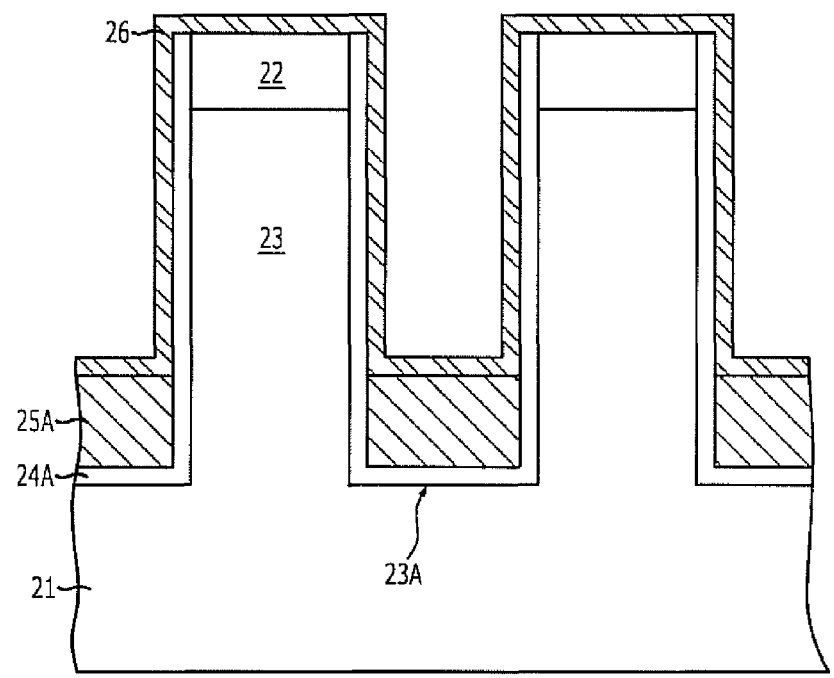

Referring to FIG. 7D, a second liner layer 26 is formed as an insulation layer over the resultant structure with the first anti-doping layer 25A formed therein. The second liner layer 26 includes a nitride layer, e.g., silicon nitride layer.

Figure 7E:
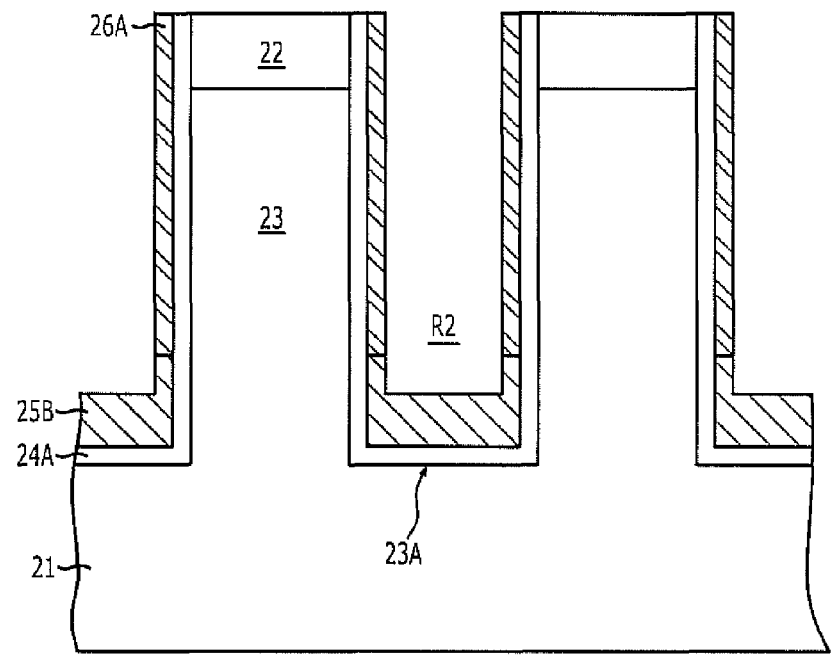

Referring to FIG. 7E, the second liner layer 26 is etched to thereby form a second liner pattern 26A. Subsequently, the first anti-doping layer 25A is recessed to a predetermined depth by using the second liner pattern 26A as an etch barrier. As a result, a second recess R2 is formed. The first anti-doping layer with the second recess R2 is denoted by a reference numeral "25B" and referred to as "a first anti-doping pattern 25B."

Figure 7F:
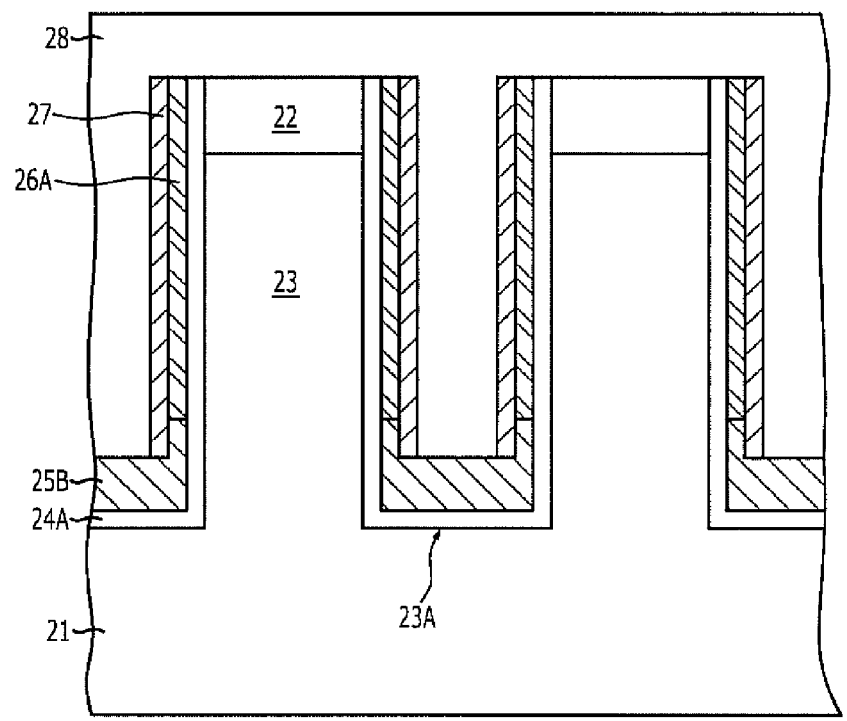

Referring to FIG. 7F, a metal nitride layer is conformally formed over the resultant structure with the second recess R2 formed therein. Subsequently, a spacer etch process is performed to thereby form a second anti-doping layer 27. The second anti-doping layer 27 is formed over both sidewalls of the conductive structure 23. The second anti-doping layer 27 may be a titanium nitride (TiN) layer.

A second gap-fill layer 28 gap-filling the second recess R2 with the second anti-doping layer 27 is formed. The second gap-fill layer 28 includes an oxide layer. The second gap-fill layer 28 may be a spin on dielectric (SOD) layer.

Figure 7G:
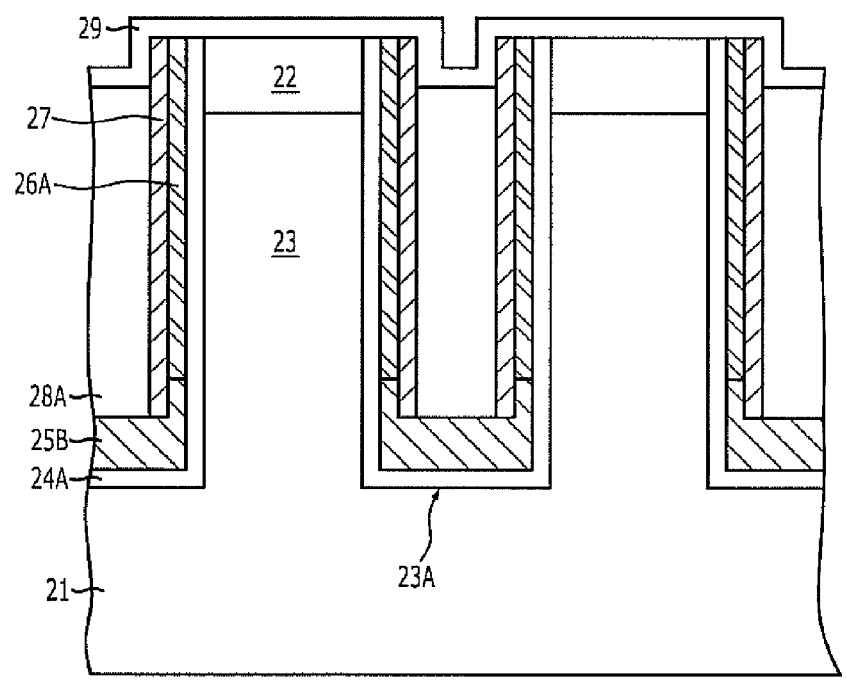

Referring to FIG. 7G, the second gap-fill layer 28 is planarized and then undergoes an etch-back process. Accordingly, a recessed second gap-fill pattern 28A is formed.

An etch barrier 29 is formed over the resultant structure with the second gap-fill pattern 28A formed therein. The etch barrier 29 may be formed of undoped polysilicon.

Figure 7H:
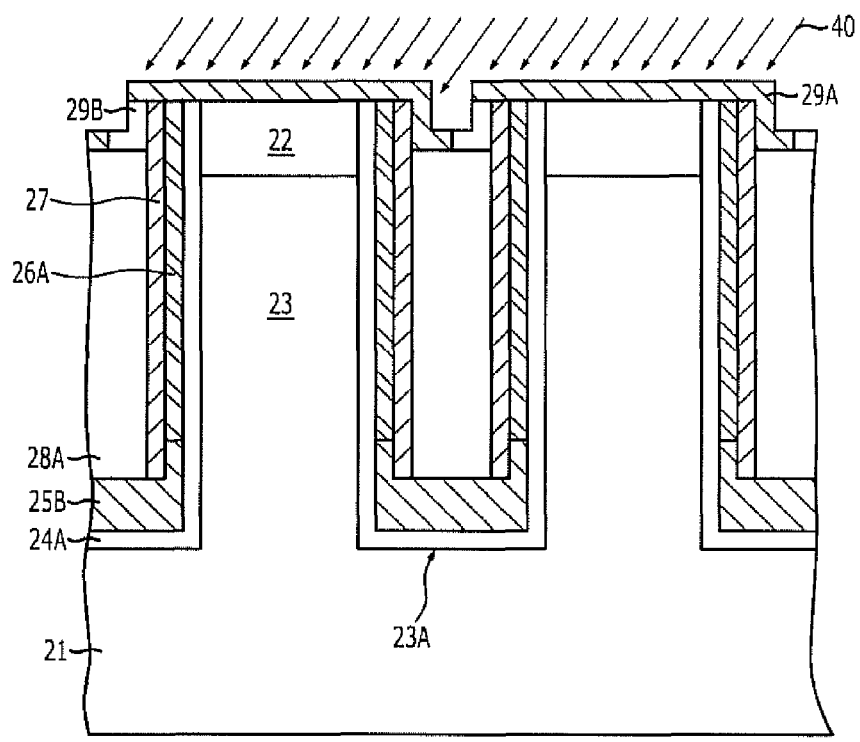

Referring to FIG. 7H, a tilt ion implantation process 40 is performed.

The tilt ion implantation process 40 is performed to implant the ions of the dopant at a predetermined tilt angle. The dopant is implanted into a portion of the etch barrier 29.

The tilt ion implantation process 40 is performed at a predetermined angle. The angle ranges from approximately 5 to approximately 30°. The hard mask layer 22 blocks a part of ion beam. Therefore, a portion of the etch barrier 29 is doped, and the others remain undoped. For example, when the dopant that is ion-implanted is a P-type dopant, e.g., boron (B), boron difluoride (BF2) is used to ion-implant the boron. As a result, a portion of the etch barrier 29 remain undoped, which is a portion formed over the left side of the hard mask layer 22.

A portion of the etch barrier 29 formed on the upper surface of the hard mask layer 22 by the tilt ion implantation process 40 of the dopant and a portion formed over the right side of the hard mask layer 22 become a doped etch barrier 29A doped with the dopant. The etch barrier into which the dopant is not implanted become an undoped etch barrier 29B.

Figure 7I:
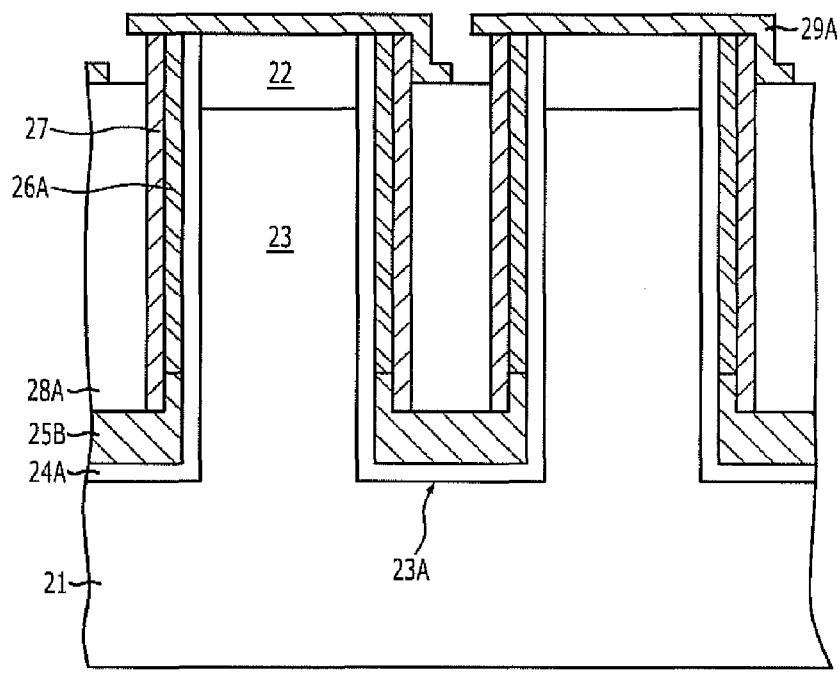

Referring to FIG. 7I, the undoped etch barrier 29B is shown to have been removed. Herein, polysilicon used as the etch barrier has a different etch rate according to whether it is doped with the dopant or not. Particularly, the undoped polysilicon into which the dopant is not implanted has a fast wet etch rate. Therefore, the undoped polysilicon is selectively removed using a chemical having a high selectivity, which may wet-etch, for example, only undoped polysilicon. The undoped etch barrier 29B is removed through a wet etch process or a wet cleaning process.

When the undoped etch barrier 29B is removed as described above, only the doped etch barrier 29A remains.

Figure 7J:
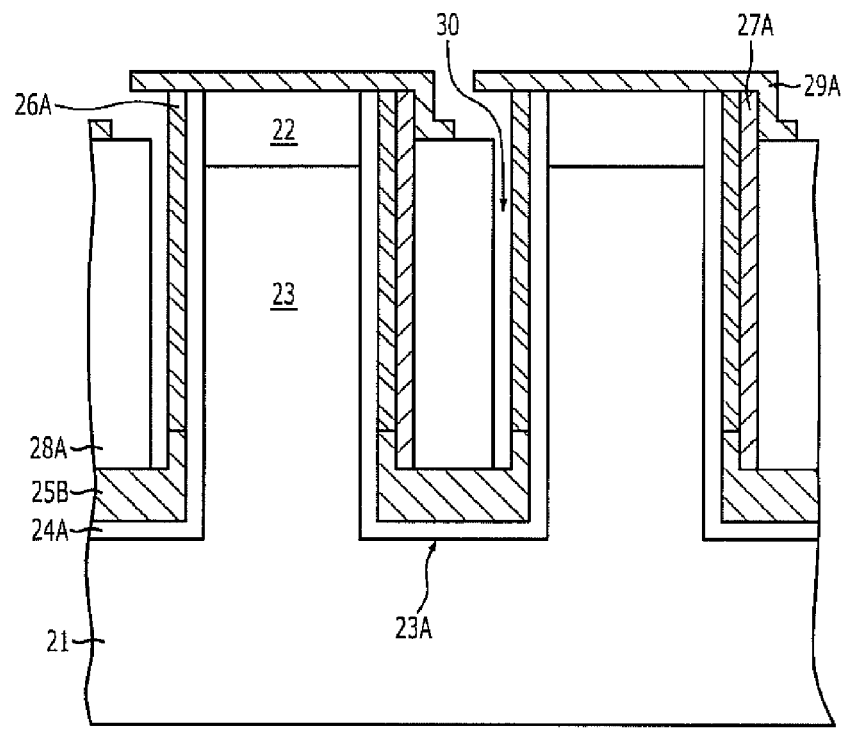

Referring to FIG. 7J, the exposed second anti-doping layers 27 are removed. Accordingly, a first gap 30 is formed. The second anti-doping layer 27 is removed through a wet etch process, and as a result, one portion of the second anti-doping layers remains. The remaining portion of the second anti-doping layers is marked with a reference numeral "27A" and referred to as a "remaining portion 27A of the second anti-doping layers."

Figure 7K:
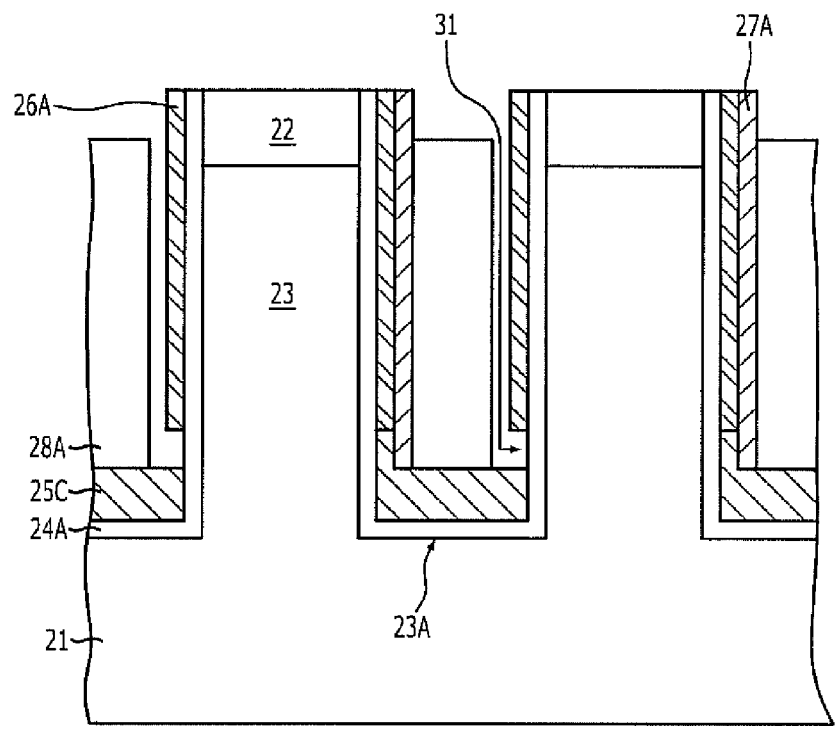

Referring to FIG. 7K, the doped etch barrier 29A is removed. Herein, since both of the doped etch barrier 29A and the first anti-doping pattern 25B are formed of polysilicon, a portion of the first anti-doping pattern 25B below the second liner pattern 26A is removed. Accordingly, a second gap 31 is formed. After the second gap 31 is formed, the first anti-doping layer remains as marked with a reference numeral "25C" and referred to as "a first anti-doping portion 25C." The first liner pattern 24A is exposed through the second gap 31.

Figure 7L:
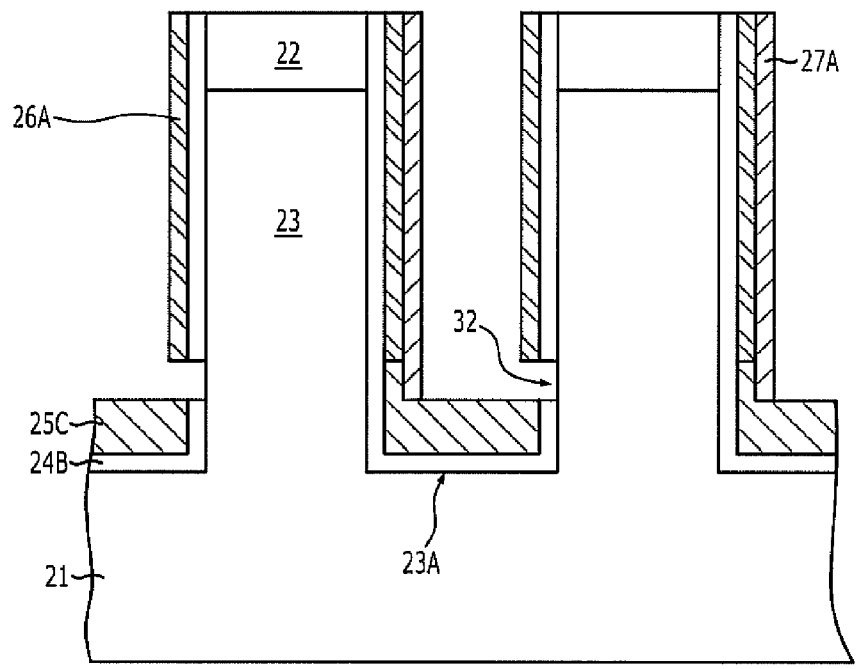

Referring to FIG. 7L, the second gap-fill pattern 28A is removed. Since both of the second gap-fill pattern 28A and the first liner pattern 24A are oxide layers, a portion of the sidewalls of the conductive structure 23 is exposed. The region exposing the portion of the sidewalls of the conductive structure 23 is referred to as an "opening 32."

In exposing the portion of the sidewalls of the conductive structure 23 corresponding to the opening 32, a cleaning process is performed.

The cleaning process may be a wet cleaning process. The wet cleaning process is performed using hydrogen fluoride (HF) or a buffered oxide etchant (BOE). With the wet cleaning process, the second gap-fill pattern 28A may be selectively removed without damaging the first anti-doping portion 25C, the remaining portion 27A of the second anti-doping layers, and the second liner pattern 26A. After the wet cleaning, an uneffected portion of the first liner pattern 24A remains. The remaining portion of the first liner pattern 24A is marked with a reference numeral "24B" and referred to as a "remaining portion 24B of the first liner pattern."

As described above, the hard mask layer 22, the remaining portion 24B of the first liner pattern, the second liner pattern 26A, the first anti-doping portion 25C, and the remaining portion 27A of the second anti-doping layers are collectively called "an anti-doping layer." Collectively, the anti-doping layer provides the opening 32 which exposes a portion of the sidewalls of the conductive structure 23.

The opening 32 corresponds to the opening 208 in FIG. 2A of the first embodiment, the opening 308 in FIG. 3A of the second embodiment, and the opening 408 in FIG. 5A of the third embodiment.

According to an exemplary embodiment of the present invention, a doped region doped with a dopant may be easily formed at a desired location of a conductive structure having a 3D structure by using a plasma doping method. Also, the doping depth and doping dose of the doped region may be controlled easily.

Moreover, since a junction is formed through the plasma doping method, shallow doping depth may be achieved and thus a shallow junction may be formed without a floating body effect.

By using the plasma doping method performed according to an exemplary embodiment of the present invention, where a shallow one-side-junction (OSJ) is formed, a semiconductor device having one-side-contacts (OSC) and buried bit lines (BBL) may be formed. In particular, a $4F^2$ scheme DRAM having a $4F^2$ structure may be implemented, where F denotes a minimum feature size, while improving throughput and reducing production costs.

While the present invention has been described with respect to the specific embodiments, it will be apparent to those skilled in the art that various changes and modifications may be made without departing from the spirit and scope of the invention disclosed herein.

What is claimed is:

1. A method for fabricating a semiconductor device, comprising:
    forming an active region having a sidewall by etching a substrate;
    exposing a portion of the sidewall of the active region;
    forming a junction in the exposed portion of the sidewall by performing a plasma doping process; and
    forming a protective layer on a surface of the junction,
    wherein the exposing of the portion of the sidewall of the active region comprises:
        forming a first anti-doping layer filling a portion of a gap between the active region and a second anti-doping layer covering a first sidewall of the active region; and
        forming an opening, which exposes a portion of a second sidewall of the active region by selectively removing a portion of the first anti-doping layer.

2. The method of claim 1, wherein further comprising:
    performing an annealing process to activate the junction after the forming of the protective layer.

3. The method of claim 2, wherein the annealing process includes a rapid thermal annealing (RTA).

4. The method of claim 1, wherein the forming of the protective layer comprises:
    oxidizing the surface of the junction.

5. The method of claim 1, wherein the forming of the protective layer is performed while an annealing process for activating the junction is performed simultaneously.

6. The method of claim 5, wherein the annealing process is performed in an atmosphere of an oxygen-containing gas.

7. The method of claim 5, wherein the annealing process is performed in an atmosphere of a nitrogen-containing gas.

8. The method of claim 1, wherein the plasma doping is performed with a doping energy of lower than approximately 20 KV in a doping dose of approximately $1\times1015$ to approximately $1\times1017$ atoms/cm2.

9. The method of claim 1, wherein the anti-doping layer includes an insulation material.

10. The method of claim 1, wherein the anti-doping layer includes at least one selected from the group consisting of an oxide layer, a nitride layer, an undoped polysilicon layer, and a metal nitride layer.

11. The method of claim 1, wherein the opening is formed to open a portion of the sidewall of the active region in a line shape.

12. The method of claim 1, wherein the active region includes line-type silicon pillars each having the first sidewall and the second sidewall.

13. The method of claim 1, further comprising:
    removing the protective layer;
    forming a side contact coupled to the junction; and
    forming a buried bit line electrically coupled to the junction through the side contact.

14. A method for fabricating a semiconductor device, comprising:
    forming a conductive structure having a sidewall by etching a substrate with a hard mask pattern used as an etch barrier;
    forming a liner layer covering the conductive structure;
    forming a first anti-doping layer filling a portion of a gap between the conductive structure and a second anti-doping layer covering a first sidewall of the conductive structure over the liner layer;
    forming a contact region exposing a portion of a second sidewall of the conductive structure by removing the liner layer and a portion of the first anti-doping layer formed over the second sidewall;
    forming a junction in the contact region by performing a plasma doping process;
    removing the second anti-doping layer;

forming a protective layer on a surface of the junction; and
removing the first anti-doping layer.

\* \* \* \* \*